United States Patent
Liu (10) Patent No.: US 11,464,121 B2
(45) Date of Patent: Oct. 4, 2022

(54) DISPLAY-SCREEN STRETCH AND RETRACTION AUXILIARY MECHANISM AND ELECTRONIC APPARATUS

(71) Applicant: BEIJING XIAOMI MOBILE SOFTWARE CO., LTD., Beijing (CN)

(72) Inventor: Zhenhua Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/327,589

(22) Filed: May 21, 2021

(65) Prior Publication Data
US 2022/0183166 A1 Jun. 9, 2022

(30) Foreign Application Priority Data

Dec. 7, 2020 (CN) .......................... 202011438496.2

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC ... H05K 5/0217; H05K 5/0017; G06F 1/1652
See application file for complete search history.

(56) References Cited

U.S. PATENT DOCUMENTS

| 10,976,775 B1* | 4/2021 | Cha ........................ G06F 1/1652 |
| 2007/0146243 A1* | 6/2007 | Ou Yang ............... G06F 1/1601 |
| | | 345/76 |
| 2012/0162876 A1* | 6/2012 | Kim ...................... G06F 1/1652 |
| | | 361/679.01 |
| 2013/0058063 A1 | 3/2013 | O'Brien |
| 2018/0014417 A1* | 1/2018 | Seo ........................ H05K 1/189 |
| 2020/0363841 A1* | 11/2020 | Kim ...................... G06F 1/1626 |

FOREIGN PATENT DOCUMENTS

EP 2469808 A2 6/2012

OTHER PUBLICATIONS

European Patent Application No. 21176170.5 extended Search and Opinion dated Nov. 19, 2021, 7 pages.

* cited by examiner

*Primary Examiner* — James Wu
*Assistant Examiner* — Sagar Shrestha
(74) *Attorney, Agent, or Firm* — Lathrop GPM LLP (57) ABSTRACT

A display-screen stretch and retraction auxiliary mechanism and an electronic apparatus are provided. The electronic apparatus includes a flexible display screen having an end fixed to a front face of the electronic apparatus, and another end extending via a side face of the electronic apparatus to a rear face of the electronic apparatus. The mechanism includes: a sliding member connected with the flexible display screen arranged on the rear face; a bracket slidably connected with the sliding member and arranged between the sliding member and the side face, and configured to be driven to apply a first action force towards the side face to the flexible display screen; and an elastic member having a first end connected to the sliding member and a second end fixed relative to the bracket, and configured to apply a second action force, facing away from the side face, to the sliding member.

20 Claims, 6 Drawing Sheets

DISPLAY-SCREEN STRETCH AND RETRACTION AUXILIARY MECHANISM AND ELECTRONIC APPARATUS

CROSS-REFERENCE TO RELATED APPLICATION

The present disclosure is based upon and claims priority to Chinese Patent Application No. 202011438496.2, filed on Dec. 7, 2020, the entire content of which is incorporated herein by reference.

TECHNICAL FIELD

The present disclosure relates to a technical field of electronic apparatuses, and more particularly to a display-screen stretch and retraction auxiliary mechanism and an electronic apparatus.

BACKGROUND

A flexible display screen is a development trend of a display screen. Deformation characteristics of the flexible display screen enrich usage states of an electronic apparatus. For example, the flexible display screen may be configured as a stretchable display screen. In the electronic apparatus with the stretchable display screen, a stretched state and a retracted state may be realized by the stretchable display screen. For this kind of electronic product, how to effectively switch the display screen between the stretched state and the retracted state is an urgent problem to be solved.

SUMMARY

Embodiments of a first aspect of the present disclosure provide a display-screen stretch and retraction auxiliary mechanism for an electronic apparatus. The electronic apparatus has a flexible display screen, one end of the flexible display screen is fixed to a front face of the electronic apparatus, and the other end of the flexible display screen extends via a side face of the electronic apparatus to a rear face of the electronic apparatus. The mechanism is arranged in the electronic apparatus and includes: a sliding member connected with the flexible display screen arranged on the rear face; a bracket slidably connected with the sliding member and arranged between the sliding member and the side face, and the bracket being configured to be driven to apply a first action force towards the side face to the flexible display screen, to allow the sliding member to move close to the bracket; and an elastic member having a first end connected to the sliding member and a second end fixed relative to the bracket, the elastic member being configured to apply a second action force facing away from the side face to the sliding member, so as to drive the sliding member to move away from the bracket.

Embodiments of a second aspect of the present disclosure provide an electronic apparatus, which includes a flexible display screen and the display-screen stretch and retraction auxiliary mechanism. The flexible display screen has an end fixed to a front face of the electronic apparatus, and another end of the flexible display screen extending via a side face of the electronic apparatus to a rear face of the electronic apparatus. The mechanism includes: a sliding member connected with the flexible display screen arranged on the rear face; a bracket slidably connected with the sliding member and arranged between the sliding member and the side face, and the bracket being configured to be driven to apply a first action force towards the side face to the flexible display screen, to allow the sliding member to move close to the bracket; and an elastic member having a first end connected to the sliding member and a second end fixed relative to the bracket, the elastic member being configured to apply a second action force facing away from the side face to the sliding member, so as to drive the sliding member to move away from the bracket.

BRIEF DESCRIPTION OF THE DRAWINGS

The accompanying drawings, which are incorporated in and constitute a part of this specification, illustrate embodiments consistent with the present disclosure and, together with the description, serve to explain the principles of the invention.

DETAILED DESCRIPTION

Illustrative embodiments of the present disclosure will be described in details herein, and the examples thereof are illustrated in the accompanying drawings. When the description below concerns the drawings, the same numbers in different drawings represent the same or similar elements unless indicated otherwise. In the following illustrative embodiments, the embodiments illustrated do not represent all the embodiments consistent with the present disclosure. Instead, they are merely examples of devices and methods consistent with some aspects of the present disclosure as detailed in the appended claims.

The terms used in the present disclosure are merely for the purpose of describing specific embodiments, which are not intended to limit the present disclosure. Unless defined otherwise, the technical or scientific terminologies used in the present disclosure shall be the general meaning understood by those skilled in the related art of the present disclosure. Terms such as "one" or "a" used in the descriptions or the appended claims do not refer to a quantity limitation, but indicate that there exists at least one. Unless specified otherwise, terms such as "comprise" or "include" or the like mean that an element or an object presented before "comprise" or "include" contain an element or an object presented after "comprise" or "include" and its equivalents, but other elements or objects are not excluded. The terms "mounted," "connected," or the like are not restricted to physical or mechanical connections, may also be electrical connections, no matter direct or indirect. As used in the descriptions and the appended claims of the present disclosure, "a," "said" and "the" in a singular form intend to include a plural form, unless clearly indicated in the context otherwise. It should also be understood that, the term "and/or" used herein contains any and all possible combinations of one or more associated listed items.

Embodiments of the present disclosure provide a display-screen stretch and retraction auxiliary mechanism and an electronic apparatus, through which the display screen may be switched between a stretched state and a retracted state. In order to explain an overall solution, an introduction to the display-screen stretch and retraction auxiliary mechanism then is made below in combination with a structure of electronic apparatus.

In the embodiments of the present disclosure, the electronic apparatus include but is not limited to: smart phones, tablet computers, desktop/laptop/handheld computers, laptops, ultra-mobile personal computers (UMPC), personal digital assistants (PDA), augmented reality (AR)/virtual reality (VR) devices. The attached drawings only use the mobile phone as an example for illustration.

Figure 1:
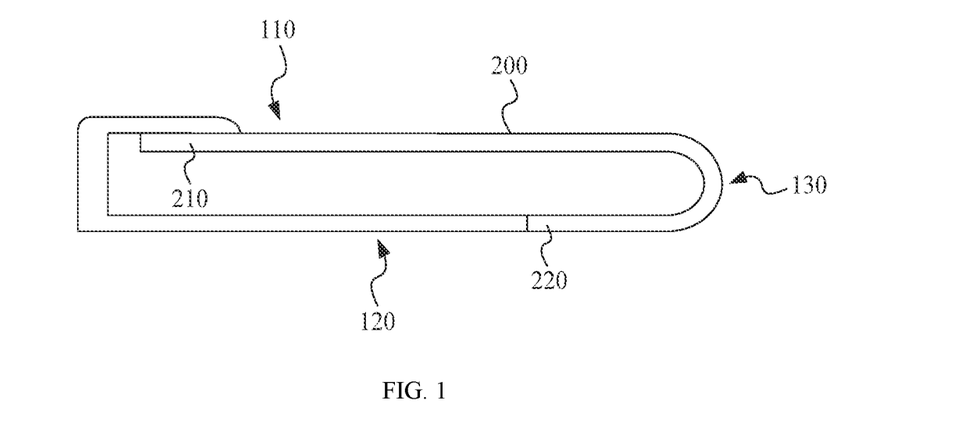
FIG. 1 is a schematic view of an electronic apparatus according to an illustrative embodiment of the present disclosure.

FIG. 1 is a schematic view of an electronic apparatus according to an illustrative embodiment of the present disclosure. As illustrated in FIG. 1, the electronic apparatus has a front face 110, a rear face 120, and a side face 130. The side face 130 is connected with the front face 110 and the rear face 120. The electronic apparatus further includes a flexible display screen 200 having one end 210 fixed to the front face 110 of the electronic apparatus and the other end 220 extending to the rear face 120 of the electronic apparatus via the side face 130 of the electronic apparatus. As such, the flexible display screen 200 is continuously distributed on the front face 110, the side face 130 and the rear face 120 of the electronic apparatus.

Figure 2:
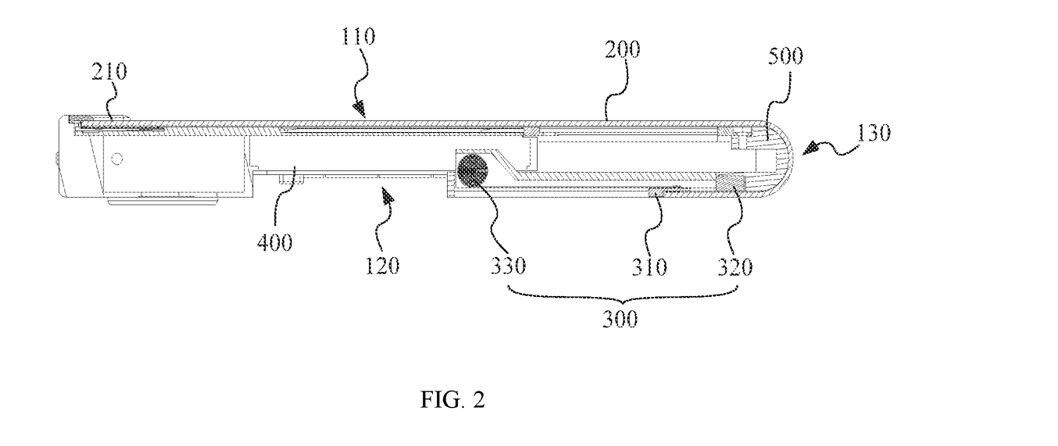
FIG. 2 is a sectional view of a display-screen stretch and retraction auxiliary mechanism in an electronic apparatus according to an illustrative embodiment of the present disclosure.

When in use, the electronic apparatus has two usage states, namely the stretched state and the retracted state. As illustrated in FIG. 2, in the stretched state, a part of the flexible display screen 200 located at the rear face 120 of the electronic apparatus is turned over via the side face 130 to the front face 110 of the electronic apparatus to increase a display screen size of the front face 110 of the electronic apparatus. In the retracted state, a part of the flexible display screen 200 located on the front face 110 of the electronic apparatus is turned over via the side face 130 to the rear face 120 of the electronic apparatus to reduce the display screen size of the front face 110 of the electronic apparatus.

To sum up, the electronic apparatus provided by the embodiments of the present disclosure realizes the switching between different usage states of the electronic apparatus through the stretch and retraction flexible display screen 200. The display-screen stretch and retraction auxiliary mechanism is arranged in the electronic apparatus to assist in stretch and retraction of the flexible display.

Figure 3A:
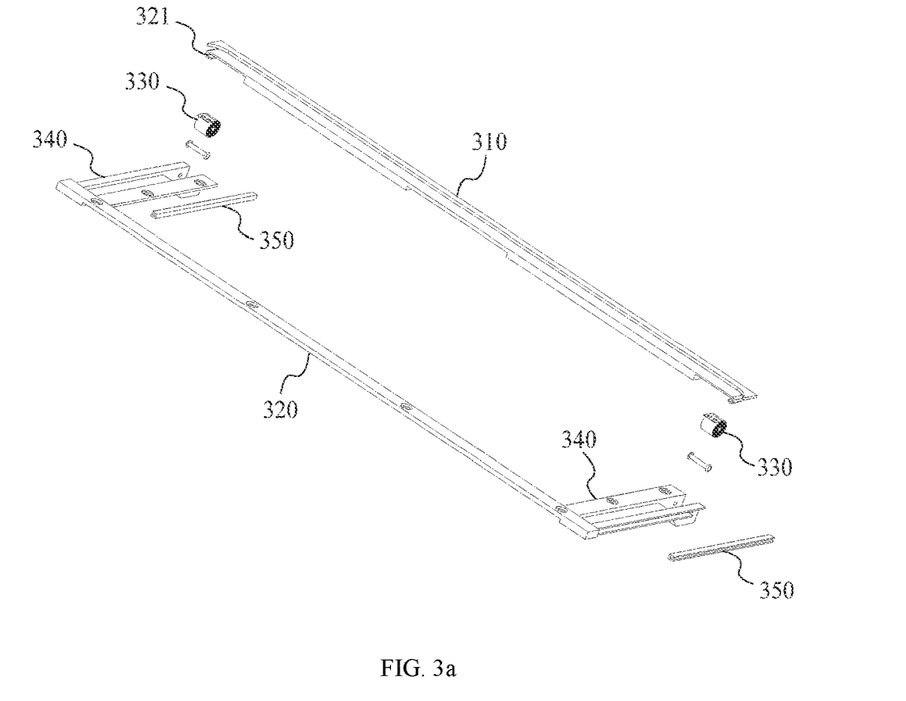
FIG. 3a is an exploded view of a display-screen stretch and retraction auxiliary mechanism according to an illustrative embodiment of the present disclosure.
Figure 3B:
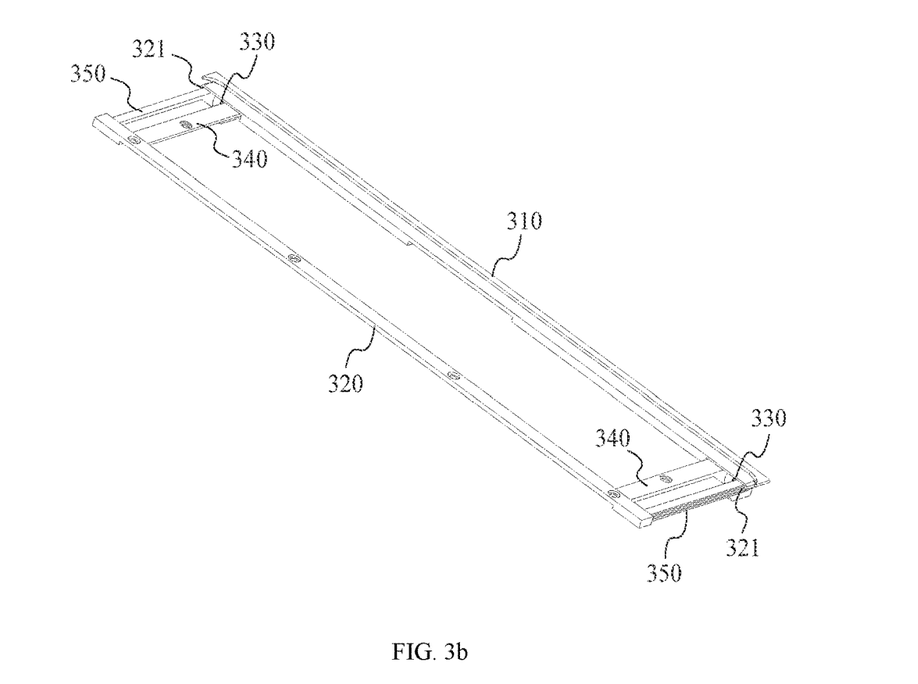
FIG. 3b is a schematic view of a display-screen stretch and retraction auxiliary mechanism according to an illustrative embodiment of the present disclosure.

FIG. 2 is a sectional view of a display-screen stretch and retraction auxiliary mechanism in an electronic apparatus according to an illustrative embodiment of the present disclosure, FIG. 3a is an exploded view of a display-screen stretch and retraction auxiliary mechanism according to an illustrative embodiment of the present disclosure, and FIG. 3b is a schematic view of a display-screen stretch and retraction auxiliary mechanism according to an illustrative embodiment of the present disclosure.

As illustrated in FIG. 2, a display-screen stretch and retraction auxiliary mechanism 300 is arranged in the electronic apparatus. Moreover, combined with FIG. 3a and FIG. 3b, the display-screen stretch and retraction auxiliary mechanism includes a sliding member 310, a bracket 320 and an elastic member 330.

The sliding member 310 is connected with the flexible display screen 200 located on the rear face 120 of the electronic apparatus. For example, the sliding member 310 is provided with an adhesive through which the sliding member 310 is connected with a face of the flexible display screen 200 towards an interior of the electronic apparatus. In such a case, when the flexible display screen 200 moves from the rear face 120 of the electronic apparatus to the front face 110 of the electronic apparatus, the flexible display screen 200 applies an action force towards the side face 130 to the sliding member 310.

The bracket 320 is slidably connected with the sliding member 310. Specifically, the bracket 320 and the sliding member 310 can slide relative to each other in a direction perpendicular to the side face 130 of the electronic apparatus. For example, referring to FIG. 3a and FIG. 3b, a guide member 350 is also arranged to and movably connected with the bracket 320, such that the sliding member 310 can slide along the guide member 350, so as to ensure a stable movement of the sliding member 310 relative to the bracket 320.

The guide member 350 is connected with the bracket 320 through a fastener, or the guide member 350 is integrally formed with the bracket 320. The guide member 350 is made of polyoxymethylene (POM), which has a self-lubricating function. Friction between the guide member 350 and the sliding element 310 can be reduced by using this material to make the guide member 350.

The sliding member 310 is provided with a guide groove 321 fitted with the guide member 350. As illustrated in FIG. 3b, the sliding member 310 is provided with the guide groove 321 having a lateral opening. The guide member 350 is configured to be inserted into the guide groove 321. In the embodiments of the present disclosure, the arrangement of the guide groove 321 is not limited, as long as the guide groove 321 can be fitted with the guide member 350. Of course, the sliding member 310 may also be provided with a projection key, the guide member 350 may be provided with a guide groove fitted with the projection key, and the projection key is configured to be inserted into the guide groove.

Figure 4A:
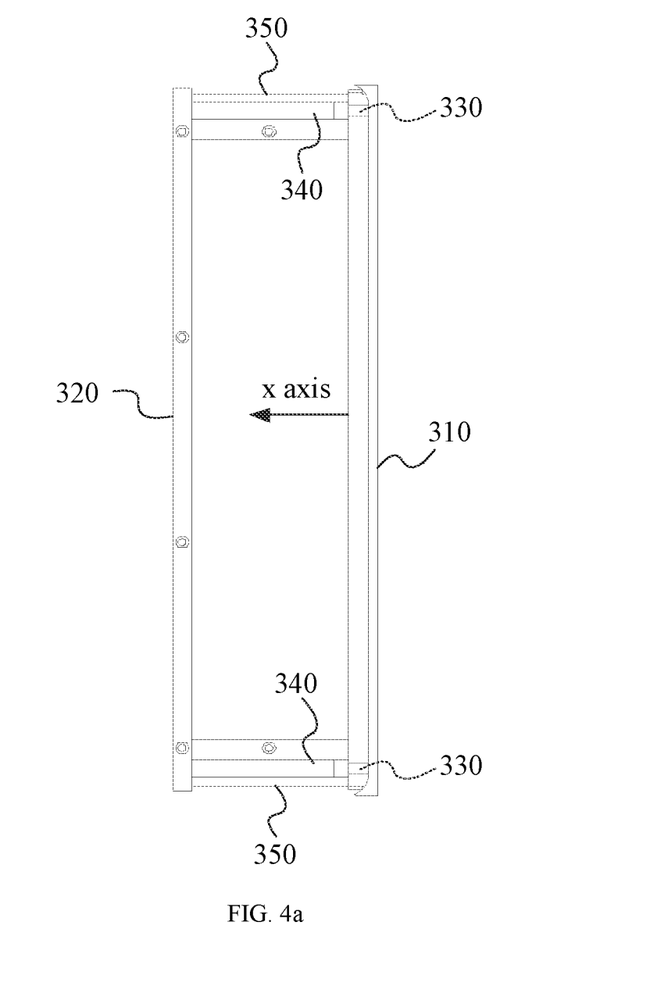
FIG. 4a and FIG. 4b are schematic views of a display-screen stretch and retraction auxiliary mechanism in different usage states according to an illustrative embodiment of the present disclosure.
Figure 4B:
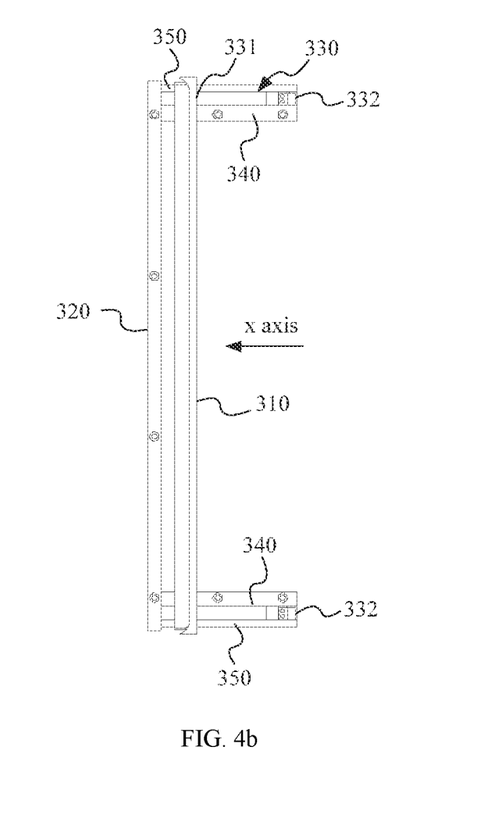

FIG. 4a and FIG. 4b are schematic views of a display-screen stretch and retraction auxiliary mechanism in different use states according to an illustrative embodiment of the present disclosure. On the basis of FIG. 2 and in combination with FIG. 4a and FIG. 4b, the sliding member 310 may move close to or away from the bracket 320 along an x axis. Moreover, the bracket 320 is arranged between the sliding member 310 and the side face 130 of the electronic apparatus. In this case, when subjected the action of the flexible display screen 200, the sliding member 310 may slide close to the bracket 320.

The bracket 320 is configured to bear an external force drive and apply an action force towards the side face 130 of the electronic apparatus to the flexible display screen 200. A driving mechanism 400 is arranged in the electronic apparatus, and the driving mechanism 400 is connected with the bracket 320 in the display-screen stretch and retraction auxiliary mechanism to drive the bracket 320 to move towards or away from the side face 130. The electronic apparatus is also provided with a movable mechanism 500 abutting against a part of the flexible display screen 200 corresponding to the side face 130 and fixedly connected to the bracket 320 in the display-screen stretch and retraction auxiliary mechanism.

In this case, combined with FIG. 4*a*, the bracket 320 is driven by the driving mechanism 400, so as to drive the movable mechanism 500 to apply a push force to the flexible display screen 200 along a positive direction of the x axis. Furthermore, since a part of the flexible display screen 200 located on the front face 110 of the electronic apparatus is fixed, the flexible display screen 200 tends to move from the rear face 120 to the front face 110 under the push force applied by the bracket 320. In this case, the flexible display screen 200 applies an action force to the sliding member 310 along the positive direction of the x axis, and then drives the sliding member 310 to move close to the bracket 320. Thus, an end of the flexible display screen 200 on the rear face 120 of the electronic apparatus moves towards the side face 130, such that the flexible display screen on the rear face 120 turns over to the front face 110, and hence a size of the flexible display screen on the front face 110 of the electronic apparatus is enlarged.

The elastic member 330 includes a first end 331 and a second end 332. The first end 331 is connected with the sliding member 310, and the second end 332 is relatively fixed with the bracket 320. In this way, the elastic member 330 deforms with a relative movement of the sliding member 310 and the bracket 320. Moreover, the elastic member 330 is configured to apply an action force facing away from the side face 130 (that is, an action force along a negative direction of the x axis) to the sliding member 310, so as to drive the sliding member 310 to away from the bracket 320 (as illustrated in FIG. 4*b*). The elastic member 330 drives the sliding member 310 to move away from the bracket 320, such that the sliding member 310 drives the flexible display screen 200 to turn over from the front face 110 of the electronic apparatus to the rear face 120 of the electronic apparatus, thereby reducing the size of the flexible display screen 200 on the front face 110 of the electronic apparatus.

In the embodiments of the present disclosure, there are two arrangements for the elastic member 330, which are described separately as follows.

Figure 5:
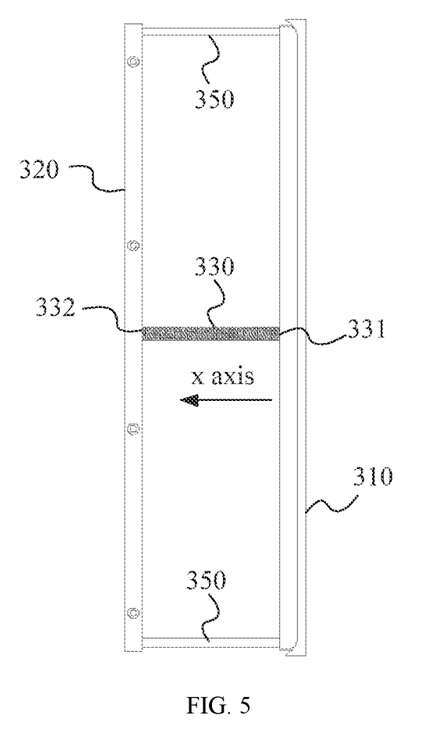
FIG. 5 is a schematic view of a display-screen stretch and retraction auxiliary mechanism according to another illustrative embodiment of the present disclosure.

FIG. 5 is a schematic view of a display-screen stretch and retraction auxiliary mechanism according to another illustrative embodiment. As illustrated in FIG. 5, the elastic member 330 has a first arrangement. Specifically, the elastic member 330 is arranged between the sliding member 310 and the bracket 320, the first end 331 is connected with the sliding member 310, and the second end 332 is directly connected with the bracket 320.

When the sliding member 310 is driven by the flexible display screen 200 to move close to the bracket 320, the elastic member 330 is in a compressed state, and applies an action force to the sliding member 310 in the negative direction of the x axis. Moreover, under an action of the bracket 320 driven by the driving mechanism 400, the flexible display screen 200 applies an action force in the positive direction of the x axis to the sliding member 310. Based on the joint action of the flexible display screen 200 and the elastic member 330, the sliding member 310 is in a stationary stable state.

When the driving mechanism 400 drives the bracket 320 to retract, that is, the bracket 320 is driven to move along the negative direction of the x axis, the force applied by the flexible display screen 200 along the positive direction of the x axis to the sliding member 310 is weakened. The elastic member 330 tends to stretch, and may drive the sliding member 310 to move away from the bracket 320. Furthermore, the sliding member 310 drives the flexible display screen 200 to turn over from the front face 110 of the electronic apparatus to the rear face 120 of the electronic apparatus, thus reducing the size of the flexible display screen 200 on the front face 110 of the electronic apparatus.

Figure 6A:
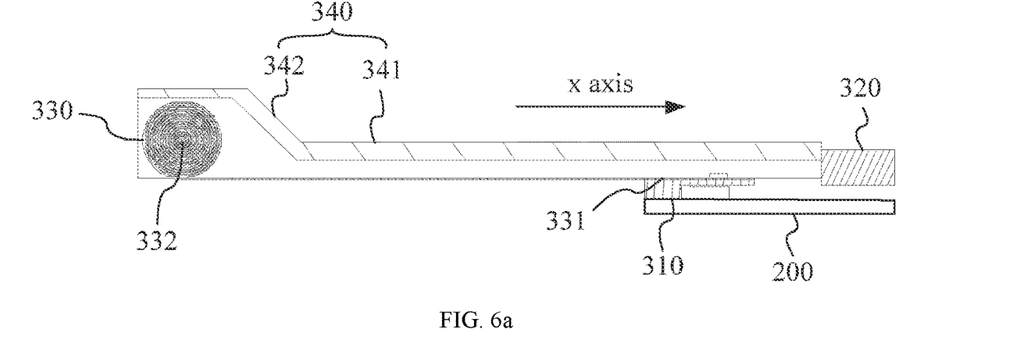
FIG. 6a is a sectional view of the display-screen stretch and retraction auxiliary mechanism illustrated in FIG. 4a of the present disclosure.
Figure 6B:
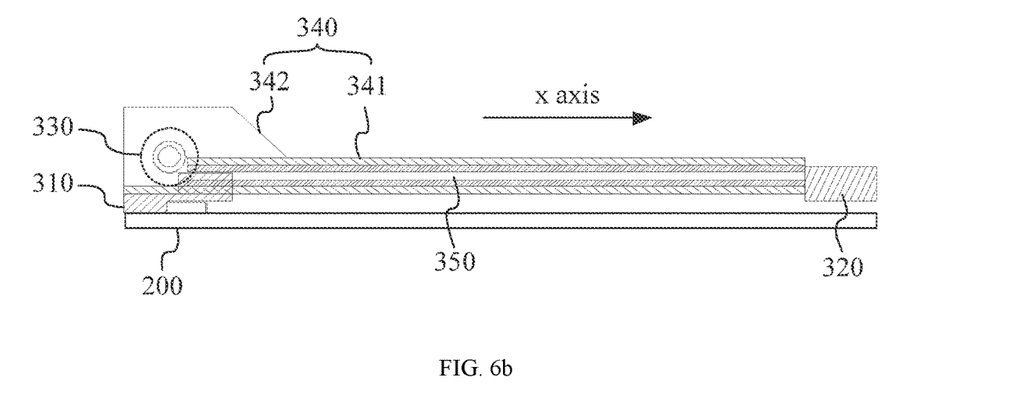
FIG. 6b is a sectional view of the display-screen stretch and retraction auxiliary mechanism illustrated in FIG. 4b of the present disclosure.

FIG. 6*a* is a sectional view of the display-screen stretch and retraction auxiliary mechanism illustrated in FIG. 4*a*, and FIG. 6*b* is a sectional view of the display-screen stretch and retraction auxiliary mechanism illustrated in FIG. 4*b*. As illustrated in FIG. 6*a* and FIG. 6*b*, the elastic member 330 has a second arrangement. Specifically, the first end 331 of the elastic member 330 and the sliding member 310 are arranged on the same side of the bracket 320, and the second end 332 maintains a preset distance from the bracket 320. Thus, the elastic member 330 is configured to be pulled to apply a force to the sliding member 310.

In some embodiments of the present disclosure, a mounting member 340 is arranged to the bracket 320, and the mounting member 340 includes an extension portion 341 and a mounting portion 342. The extension portion 341 is connected with the bracket 320 and extends to a side where the sliding member 310 is. The mounting portion 342 is connected with a part of the extension portion 341 away from the bracket 320, and the mounting portion 342 is configured for mounting of the second end 332 of the elastic member 330. That is, the second end 332 of the elastic member 330 is mounted to the mounting portion 342. In this way, the second end 332 of the elastic member 330 maintains the preset distance from the bracket 320 by the extension portion 341.

Combining with FIG. 6*a* and FIG. 4*a*, when the sliding member 310 is driven by the flexible display screen 200 to move close to the bracket 320, the elastic member 330 is in a stretched state. In this case, the elastic member 330 applies an action force in the negative direction of the x axis to the sliding member 310. Moreover, under the action of the bracket 320 driven by the driving mechanism 400, the flexible display screen 200 applies an action force in the positive direction of the x axis to the sliding member 310. Based on the joint action of the flexible display screen 200 and the elastic member 330, the sliding member 310 is in a stationary stable state.

Combining with FIG. 6*b* and FIG. 4*b*, when the driving mechanism 400 drives the bracket 320 to retract, that is, the driving bracket 320 moves along the negative direction of the x axis, the action force along the positive direction of the x axis applied by the flexible display screen 200 to the sliding member 310 is weakened. Thus, the elastic member 330 tends to retract, and may drive the sliding member 310 to move away from the bracket 320. Furthermore, the sliding member 310 drives the flexible display screen 200 to turn over from the front face 110 of the electronic apparatus to the rear face 120 of the electronic apparatus, thus reducing the size of the flexible display screen 200 on the front face 110 of the electronic apparatus.

Further, the embodiments of the present disclosure provide an implementation manner of the mounting member.

Figure 7:
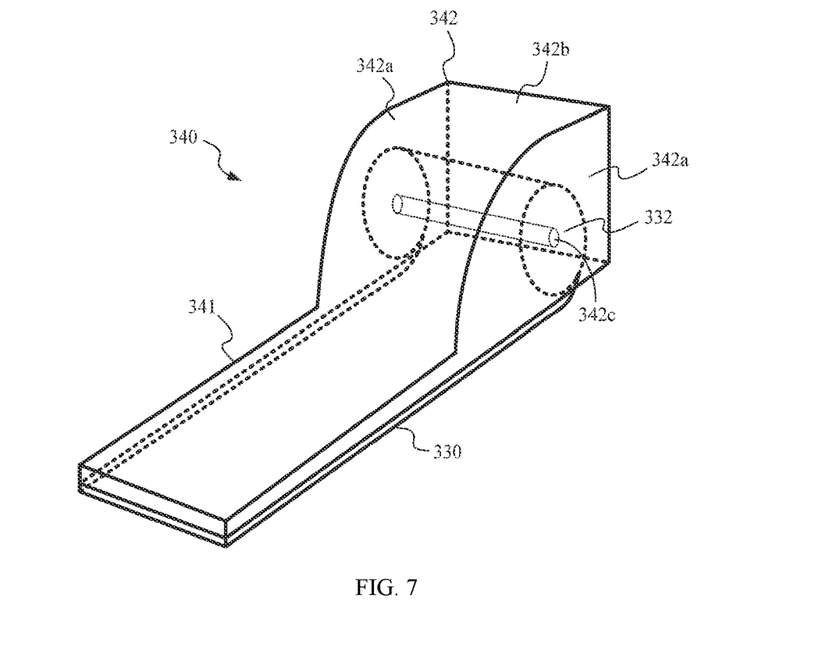
FIG. 7 is a schematic view of a mounting member in a display-screen stretch and retraction auxiliary mechanism according to an illustrative embodiment of the present disclosure.

FIG. 7 is a schematic view of a mounting member in a display-screen stretch and retraction auxiliary mechanism according to an illustrative embodiment. As illustrated in FIG. 7, the mounting portion 342 includes a side wall 342a connected with the extension portion 341, and the side wall 342a extends towards the front face 110 of the electronic apparatus. In some embodiments of the present disclosure, the mounting portion 342 includes the side walls 342a arranged opposite to each other and a top wall 342b connected to the side walls 342a. A part of the top wall 342b is connected with a top of the side wall 342a (that is, a part of the side wall 342a close to the front face), and another part of the top wall 342b is inclined towards the rear face of the electronic apparatus and extends downwards to be connected with the extension portion 341.

In this way, the mounting portion 342 forms a cavity protruding towards the front face of the electronic apparatus, and the elastic member 330 is mounted in the cavity. In such a manner, the structural safety of the elastic member 330 is ensured through the mounting portion 342.

Moreover, a support member 342c is arranged to the side wall 342a, and the support member 342c is parallel to the front face of the electronic apparatus. The second end 332 of the elastic member 330 is connected with the support member 342c, and the elastic member 330 is wound on the support member 342c. When stretched under an action of the sliding member 310, the elastic member 330 rotates around the support member 342c. In other words, the elastic member 330 is a resilient sheet wound on the support member 342c. In some embodiments of the present disclosure, a thickness of the resilient sheet is 0.03 mm~1 mm. In some embodiments of the present disclosure, the elastic member 330 is a volute spiral spring.

In this way, the space occupied by the elastic member 330 is reduced. Especially, a stretched or retracted part of the elastic member 330 has a sheet shape of a relatively small thickness, thus occupying a small space. In this way, on one hand, the influence of the elastic member 330 on other components in the display-screen stretch and retraction auxiliary mechanism is reduced; on the other hand, an overall volume of the display-screen stretch and retraction auxiliary mechanism is reduced, thus facilitating the arrangement of this mechanism in the electronic apparatus.

In some embodiments of the present disclosure, referring to FIGS. 3a-3b and 4a-4b, at least two mounting members 340 are arranged to the bracket 320, and the elastic piece 330 is arranged in each mounting member 340. For example, two mounting members 340 are arranged at both ends of the bracket 320, respectively. In this way, the elastic members 330 in the two mounting members 340 apply stable forces to the sliding member 310, so as to ensure that the sliding member 310 moves stably relative to the bracket 320.

In some embodiments of the present disclosure, the elastic member 330 is a constant force spring. After a deformation stroke of the constant force spring reaches a preset value, its elastic force remains constant with an increase of the deformation stroke. In this way, as the sliding member 310 keeps getting close to the bracket 320, when the deformation stroke of the elastic member 330 exceeds the preset value, the elastic member 330 applies a constant tension to the sliding member 310, thereby weakening a driving load of the flexible display screen 200 for the sliding member 310, and further weakening a driving load of the driving mechanism 400 for the flexible display screen 200 through the bracket 320.

In the display-screen stretch and retraction auxiliary mechanism provided by the embodiments of the present disclosure, the driven bracket 320 applies an action force towards the side face 130 to the flexible display screen 200, such that the flexible display screen 200 may apply a pull force to the sliding member 310. Thus, the sliding member 310 moves close to the bracket 320 such that the flexible display screen 200 is turned over from the rear face 120 of the electronic apparatus to the front face 110 of the electronic apparatus. Moreover, during the movement of the sliding member 310 close to the bracket 320, the elastic member 330 applies an action force facing away from the bracket 320 to the sliding member 310.

By driving the driven bracket 320 to move in the direction facing away from the side face 130, the action force applied by the bracket 320 to the flexible display screen 200 is weakened. Under the action of the elastic member 330, the sliding member 310 is driven to move away from the bracket 320. Furthermore, the sliding member 310 drives the flexible display screen 200 to turn over from the front face 110 of the electronic apparatus to the rear face 120 of the electronic apparatus.

To sum up, the display-screen stretch and retraction auxiliary mechanism provided by the embodiments of the present disclosure realizes the movement of the flexible display screen 200 between the front face 110 of the electronic apparatus and the rear face 120 of the electronic apparatus, so as to support the switching between the stretched state and the retracted state of the electronic apparatus, and enrich the usage states of the electronic apparatus.

Accordingly, the electronic apparatus provided by the embodiments of the present disclosure realizes the screen stretching and retracting functions based on the flexible screen display and the display-screen stretch and retraction auxiliary mechanism. When the screen is stretched, the size of the display screen on the front face of the electronic apparatus is relatively large. When the screen is retracted, the size of the display screen of the front face 110 of the electronic apparatus is relatively small. In this way, a new manner for switching the states of the electronic apparatus is provided to meet the user's usage requirements.

Other embodiments of the disclosure will be apparent to those skilled in the art from consideration of the specification and practice of the disclosure disclosed here. The present disclosure is intended to cover any variations, uses, or adaptations of the invention which follow the general principles thereof and include such departures from the present disclosure as come within known or customary practice in the art. It is intended that the specification and embodiments should be considered as illustrative only, while a true scope and spirit of the present disclosure are indicated by the appended claims.

What is claimed is:

1. A display-screen stretch and retraction auxiliary mechanism for an electronic apparatus, wherein the electronic apparatus has a flexible display screen, one end of the flexible display screen is fixed to a front face of the electronic apparatus, an other end of the flexible display screen extends via a side face of the electronic apparatus to a rear face of the electronic apparatus, and the display-screen stretch and retraction auxiliary mechanism is arranged in the electronic apparatus and comprises:
   a sliding member connected with the flexible display screen arranged on the rear face;
   a bracket slidably connected with the sliding member and arranged between the sliding member and the side face, and the bracket being configured to be moved to apply a first action force towards the side face to the flexible display screen, to allow the sliding member to move close to the bracket; and an elastic member having a first end connected to the sliding member and a second end fixed relative to the bracket, the elastic member being configured to apply a second action force, facing away from the side face, to the sliding member, so as to drive the sliding member to move away from the bracket.

2. The display-screen stretch and retraction auxiliary mechanism according to claim 1, wherein the elastic member is arranged between the bracket and the sliding member, and is configured to be compressed to apply the second action force to the sliding member.

3. The display-screen stretch and retraction auxiliary mechanism according to claim 1, wherein the first end of the elastic member and the sliding member are arranged on the same side of the bracket, the second end of the elastic member maintains a preset distance from the bracket, and the elastic member is configured to be pulled to apply the second action force to the sliding member.

4. The display-screen stretch and retraction auxiliary mechanism according to claim 3, wherein at least one mounting member is arranged to the bracket, and the at least one mounting member comprises:
 an extension portion connected with the bracket and extending towards a side where the sliding member is; and
 a mounting portion connected with a part of the extension portion away from the bracket, and configured for mounting of the second end of the elastic member.

5. The display-screen stretch and retraction auxiliary mechanism according to claim 4, wherein the mounting portion comprises a side wall extending towards the front face of the electronic apparatus, a support member is arranged to the side wall and parallel to the front face;
 the second end of the elastic member is connected with the support member, and the elastic member is wound on the support member.

6. The display-screen stretch and retraction auxiliary mechanism according to claim 4, wherein at least two mounting members are arranged to the bracket, and the elastic member is arranged in each of the at least two mounting members.

7. The display-screen stretch and retraction auxiliary mechanism according to claim 5, wherein at least two mounting members are arranged to the bracket, and the elastic member is arranged in each of the at least two mounting members.

8. The display-screen stretch and retraction auxiliary mechanism according to claim 1, wherein the elastic member is a constant force spring.

9. The display-screen stretch and retraction auxiliary mechanism according to claim 1, wherein the bracket comprises a guide member, and the guide member is movably connected with the sliding member, so that the sliding member is configured to slide along the guide member.

10. The display-screen stretch and retraction auxiliary mechanism according to claim 9, wherein the sliding member comprises a guide groove fitted with the guide member; or
 the sliding member comprises a projection key, and the guide member comprises a guide groove fitted with the projection key.

11. An electronic apparatus, comprising:
 a flexible display screen having an end fixed to a front face of the electronic apparatus, and another end of the flexible display screen extending via a side face of the electronic apparatus to a rear face of the electronic apparatus; and
 a display-screen stretch and retraction auxiliary mechanism comprising:
 a sliding member connected with the flexible display screen arranged on the rear face;
 a bracket slidably connected with the sliding member and arranged between the sliding member and the side face, and the bracket being configured to be moved to apply a first action force towards the side face to the flexible display screen, to allow the sliding member to move close to the bracket; and
 an elastic member having a first end connected to the sliding member and a second end fixed relative to the bracket, the elastic member being configured to apply a second action force facing away from the side face to the sliding member, so as to drive the sliding member to move away from the bracket.

12. The electronic apparatus according to claim 11, further comprising a driving mechanism connected with the bracket, and configured for driving the bracket to move towards or away from the side face.

13. The electronic apparatus according to claim 11, further comprising a movable mechanism abutting against a part of the flexible display screen corresponding to the side face, and fixedly connected with the bracket.

14. The electronic apparatus according to claim 11, wherein the elastic member is arranged between the bracket and the sliding member, and is configured to be compressed to apply the second action force to the sliding member.

15. The electronic apparatus according to claim 11, wherein the first end of the elastic member and the sliding member are arranged on the same side of the bracket, the second end maintains a preset distance from the bracket, and the elastic member is configured to be pulled to apply the second action force to the sliding member.

16. The electronic apparatus according to claim 15, wherein at least one mounting member is arranged to the bracket, and the at least one mounting member comprises:
 an extension portion connected with the bracket and extending towards a side where the sliding member is; and
 a mounting portion connected with a part of the extension portion away from the bracket, and configured for mounting of the second end of the elastic member.

17. The electronic apparatus according to claim 16, wherein the mounting portion comprises a side wall extending towards the front face of the electronic apparatus, a support member is arranged to the side wall and parallel to the front face;
 the second end of the elastic member is connected with the support member, and the elastic member is wound on the support member.

18. The electronic apparatus according to claim 16, wherein at least two mounting members are arranged to the bracket, and the elastic member is arranged in each of the at least two mounting members.

19. The electronic apparatus according to claim 17, wherein at least two mounting members are arranged to the bracket, and the elastic member is arranged in each of the at least two mounting members.

20. The electronic apparatus according to claim 11, wherein the elastic member is a constant force spring.

* * * * *